(12) United States Patent
Cruzan et al.

(10) Patent No.: US 12,411,167 B2
(45) Date of Patent: Sep. 9, 2025

(54) TENSION-BASED SOCKET GIMBAL FOR ENGAGING DEVICE UNDER TEST WITH THERMAL ARRAY

(71) Applicant: Advantest Test Solutions, Inc.

(72) Inventors: Gregory Cruzan, San Jose, CA (US); Karthik Ranganathan, San Jose, CA (US); Gilberto Oseguera, San Jose, CA (US); Joe Koeth, San Jose, CA (US); Paul Ferrari, San Jose, CA (US); James Hastings, San Jose, CA (US); Chee Wah Ho, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 110 days.

(21) Appl. No.: 18/234,635

(22) Filed: Aug. 16, 2023

(65) Prior Publication Data
US 2023/0393188 A1    Dec. 7, 2023

Related U.S. Application Data

(63) Continuation-in-part of application No. 17/585,228, filed on Jan. 26, 2022, now Pat. No. 11,835,549.

(51) Int. Cl.
*G01R 31/28* (2006.01)
*G01R 1/04* (2006.01)

(52) U.S. Cl.
CPC ....... *G01R 31/2863* (2013.01); *G01R 1/0466* (2013.01); *G01R 31/2877* (2013.01); *G01R 31/2889* (2013.01)

(58) Field of Classification Search
CPC ............ G01R 31/2863; G01R 31/2867; G01R 31/2868; G01R 31/2875; G01R 31/2877;
(Continued)

(56) References Cited

U.S. PATENT DOCUMENTS 5,239,093 A    8/1993  Cheng
5,821,505 A   10/1998  Tustaniwskyj et al.
(Continued)

FOREIGN PATENT DOCUMENTS

EP         3270261 A1    1/2018
JP      2005156172 A    6/2005
(Continued)

*Primary Examiner* — Eman A Alkafawi
*Assistant Examiner* — Courtney G McDonnough

(57) ABSTRACT

Embodiments of the present invention provide a gimbaling socket structure that uses tension to bring a device under test (DUT) disposed in the socket into secure contact with a liquid cooled thermal array or the like to cool the DUT during testing. The gimbaling socket structure is secured to a tension spring and can move freely in 3 dimensions to bring the surfaces of the DUT and the thermal array (or components thereof, such as TEC/ATI layers) into even, level, and secure contact with each other, thereby preventing air gaps between surfaces and improving thermal performance. The even, secure contact between surfaces improves thermal cooling and reduces variation in cooling efficiency. In this way, more DUTs can be tested in parallel within a small test space, overall costs of the test system are reduced, and greater cooling capacity can be provided for testing high-powered devices.

20 Claims, 21 Drawing Sheets

(58) Field of Classification Search
CPC .. F28D 15/0275; F28D 15/0233; F28D 15/04; F28D 2021/0028; F28F 2275/08; F28F 3/06; F28F 9/0075; G01K 7/021; G05D 23/00; H05K 1/0203; H05K 7/20581; H10N 10/81; H10H 20/858; H10D 89/60; H10D 89/811; H01L 21/67724; H01L 21/67754; H01L 21/67775; H01L 22/00; H01L 23/36; H01L 23/3672; H01L 23/38; H01L 23/4093; H01L 23/427; H01L 2924/00; H01L 2924/0002

See application file for complete search history.

(56) References Cited

U.S. PATENT DOCUMENTS

| | | | |
|---|---|---|---|
| 6,184,504 B1 | 2/2001 | Cardella | |
| 6,359,264 B1 | 3/2002 | Schaper et al. | |
| 6,501,289 B1* | 12/2002 | Takekoshi | G01R 31/2851 |
| | | | 324/750.19 |
| 6,668,570 B2 | 12/2003 | Wall et al. | |
| 7,042,240 B2 | 5/2006 | Lopez et al. | |
| 7,151,388 B2 | 12/2006 | Gopal et al. | |
| 7,355,428 B2 | 4/2008 | Kabbani et al. | |
| 7,411,792 B2 | 8/2008 | Richards et al. | |
| 7,436,059 B1 | 10/2008 | Ouyang | |
| 7,519,880 B1 | 4/2009 | Johnson et al. | |
| 7,626,407 B2 | 12/2009 | Kabbani et al. | |
| 7,755,899 B2 | 7/2010 | Stenmark | |
| 7,830,164 B2 | 11/2010 | Earle et al. | |
| 7,848,106 B2 | 12/2010 | Merrow | |
| 8,120,304 B2 | 2/2012 | Yalei et al. | |
| 8,558,540 B2 | 10/2013 | Wu et al. | |
| 9,080,820 B2 | 7/2015 | Bolton | |
| 9,291,667 B2 | 3/2016 | Armstrong et al. | |
| 9,310,145 B2 | 4/2016 | Colongo et al. | |
| 9,414,526 B2 | 8/2016 | Mann et al. | |
| 9,494,353 B2 | 11/2016 | Yu et al. | |
| 9,766,287 B2 | 9/2017 | Naraski et al. | |
| 9,841,772 B2 | 12/2017 | Bucher | |
| 10,354,785 B2 | 7/2019 | Yamaguchi et al. | |
| 10,656,200 B2 | 5/2020 | Cruzan et al. | |
| 10,775,408 B2 | 9/2020 | Carvalho et al. | |
| 10,908,207 B2 | 2/2021 | Barabi et al. | |
| 11,835,549 B2 | 12/2023 | Cruzan | |
| 2002/0024355 A1 | 2/2002 | Suzuki et al. | |
| 2002/0118032 A1 | 8/2002 | Norris et al. | |
| 2003/0042921 A1 | 3/2003 | Hollman | |
| 2003/0155939 A1 | 8/2003 | Lutz et al. | |
| 2005/0026476 A1 | 2/2005 | Mok et al. | |
| 2005/0086948 A1 | 4/2005 | Milke-Rojo et al. | |
| 2005/0103034 A1 | 5/2005 | Hamilton et al. | |
| 2005/0151553 A1 | 7/2005 | Kabbani et al. | |
| 2006/0290370 A1 | 12/2006 | Lopez | |
| 2009/0218087 A1 | 9/2009 | Oshima | |
| 2010/0042355 A1 | 2/2010 | Aube et al. | |
| 2011/0074080 A1 | 3/2011 | Di Stefano et al. | |
| 2013/0285686 A1 | 10/2013 | Malik et al. | |
| 2014/0251214 A1 | 9/2014 | Cuvalci et al. | |
| 2015/0204942 A1* | 7/2015 | Scocchetti | G01R 1/0466 |
| | | | 324/750.05 |
| 2015/0226794 A1 | 8/2015 | Chen | |
| 2016/0084880 A1 | 3/2016 | Lociciero et al. | |
| 2016/0351526 A1 | 12/2016 | Boyd et al. | |
| 2017/0102409 A1 | 4/2017 | Sarhad et al. | |
| 2017/0219626 A1 | 8/2017 | Gardell | |
| 2019/0064254 A1 | 2/2019 | Bowyer et al. | |
| 2019/0310314 A1 | 10/2019 | Liu et al. | |
| 2019/0346482 A1 | 11/2019 | Kiyokawa et al. | |
| 2020/0363104 A1 | 11/2020 | MacDonald et al. | |
| 2020/0371155 A1 | 11/2020 | Walczyk et al. | |
| 2021/0071917 A1 | 3/2021 | Pei et al. | |
| 2021/0396801 A1 | 12/2021 | Ranganathan et al. | |
| 2022/0044084 A1 | 2/2022 | Cardy | |
| 2022/0082587 A1 | 3/2022 | Gopal et al. | |
| 2022/0137129 A1 | 5/2022 | Ranganathan et al. | |

FOREIGN PATENT DOCUMENTS

| | | |
|---|---|---|
| JP | 2008275512 A | 11/2008 |
| TW | 201504647 A | 7/2013 |
| TW | 201636618 A | 12/2014 |
| WO | 2016122039 A1 | 8/2016 |
| WO | 2017112076 A1 | 6/2017 |

* cited by examiner

TENSION-BASED SOCKET GIMBAL FOR ENGAGING DEVICE UNDER TEST WITH THERMAL ARRAY

CROSS-REFERENCE TO RELATED APPLICATION

The present application is a continuation-in-part of copending U.S. patent application Ser. No. 17/585,228, filed Jan. 26, 2022, entitled "THERMAL ARRAY WITH GIMBAL FEATURES AND ENHANCED THERMAL PERFORMANCE," which is herein incorporated by reference in its entirety for all purposes.

FIELD

Embodiments of the present invention generally relate to the field of electronic device testing. More specifically, embodiments of the present invention relate to testing systems that test a high number of devices in parallel.

BACKGROUND

A device or equipment under test (e.g., a DUT) is typically tested to determine the performance and consistency of the electronic device before the device is sold. The device can be tested using a large variety of test cases, and the results of the test cases are compared to expected output results. When the result of a test case does not match the expected output value, the device can be considered a failed device or outlier, or the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer or other electronic device. By removing defective or unsatisfactory chips at manufacture using ATE, the quality of the yield can be significantly improved.

Conventional approaches to DUT testing that regulate temperature during testing rely on using multiple cold plates per tester, which results in additional cost and complexity to accommodate the typically large cold plates. For example, fluid used for cooling must be transported to each cold plate. Other approaches to DUT testing employ air cooled superstructures or heatsinks, but fail to provide the thermal performance of liquid cooled solutions. An approach to improve thermal performance and reduce complexity of testing systems that use liquid cooling (or refrigerant cooling) and cold plates for DUT testing is needed.

SUMMARY

Accordingly, embodiments of the present invention provide testing systems with liquid cooled thermal arrays (or refrigerant cooled thermal arrays) having components that pivot freely allowing corresponding surfaces to be brought into even, level, and secure contact ("intimate contact"), thereby preventing air gaps between surfaces and improving thermal performance. In this way, advantageously more DUTs can be tested in parallel within a small test space, overall costs of the test system are reduced, and greater cooling capacity can be provided for testing high-powered devices. The test systems can include any suitable type of gimbaling mechanism featuring a tensions spring or the like and arms that lift the socket structure into position.

As described more fully below, a first embodiment of the present invention involves a test system for testing a device under test. The test system includes a socket structure coupled to a spring and operable to receive a DUT, the spring coupled to a baseplate, the spring being under tension, the baseplate operable to support the socket structure in a rest position, and a thermal array including arms operable to lift the socket structure to bring the DUT into even and secure contact with the thermal array during operation to cool the DUT when the DUT is disposed in the socket structure.

According to some embodiments, the socket structure includes a socket that receives the DUT and a socket interface board (SIB) coupled to the spring.

According to some embodiments, the baseplate includes a pair of support pillars operable to support the socket structure in the rest position.

According to some embodiments, the test system further includes thermal interface material (TIM) disposed on the DUT and the thermal array, and the arms are operable to bring the TIM disposed on the DUT and the thermal array into secure and even contact.

According to some embodiments, the socket structure is a gimbaling socket structure operable to pivot in multiple directions when lifted by the arms to provide even and secure contact between the DUT and the thermal array.

According to some embodiments, the spring is operable to bring the socket structure back to the rest position when the socket structure is lowered by the arms under tension.

According to some embodiments, the spring applies tension substantially equivalent to 1 to 3 pounds.

According to some embodiments, the baseplate includes a burn in board (BIB).

According to some embodiments, the test system further includes a plurality of socket structures, each socket structure of the plurality of socket structures operable to receive a respective DUT. The thermal array includes additional arms corresponding to each of the plurality of socket structures to bring the plurality of DUTs into secure contact with the thermal array.

According to some embodiments, the test system further includes a plurality of socket structures, each socket structure coupled to a respective spring and operable to receive a respective DUT, the springs coupled to a baseplate, the springs are under tension, the baseplate operable to support the socket structure in a rest position, and a plurality of thermal arrays, each thermal array corresponding to a respective socket structure. The thermal arrays include arms operable to lift the respective socket structure to bring the DUTs into even and secure contact with the thermal arrays during operation to cool the DUTs when the DUTs are disposed in the socket structure.

According to some embodiments, the plurality of socket structures each include a socket that receives the respective DUT and a socket interface board (SIB) coupled to the respective spring.

According to some embodiments, the baseplate includes a plurality of support pillars operable to support the plurality of socket structures in the rest position.

According to some embodiments, the test system includes a plurality of baseplates, and each baseplate supports a respective socket structure.

According to some embodiments, the test system includes thermal interface material disposed on the DUT and on the thermal array, and the arms are operable to bring the TIM disposed on the DUT and the thermal array into secure and even contact.

According to some embodiments, the plurality of socket structures includes gimbaling socket structures operable to pivot in multiple directions when lifted by the arms to provide even and secure contact between the DUTs and the thermal arrays.

According to some embodiments, the springs are operable to bring the plurality of socket structures back to the rest position when the plurality of socket structures is released by the arms.

According to some embodiments, the spring applies tension substantially equivalent to 1 to 3 lbf.

According to some embodiments, the thermal array includes a liquid cooled cold plate.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Figure 1:
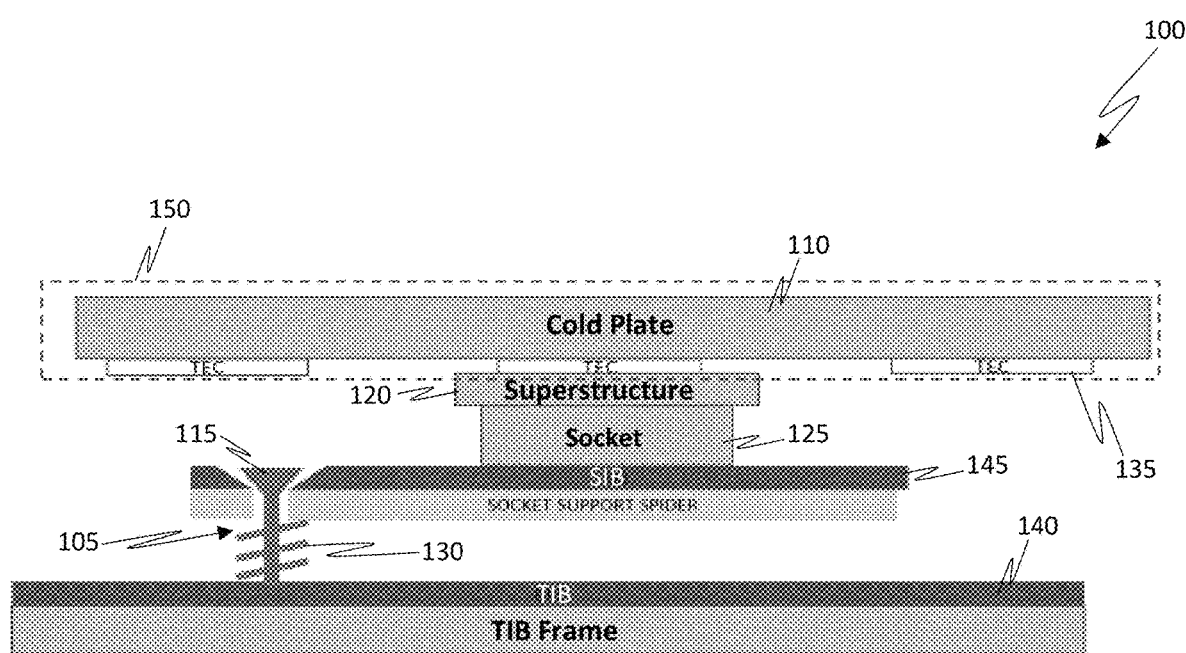
FIG. 1 is a cross section of an exemplary low-cost thermal array (LCTA) with SIBs that can gimbal in multiple directions using gimbal mounts that fix the SIBs to the TIB according to embodiments of the present invention.

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Thermal Array with Gimbal Features and Enhanced Thermal Performance

Embodiments of the present invention provide testing systems with liquid cooled thermal arrays (or refrigerant cooled thermal arrays) that can pivot/rotate about a fixed axis thereby allowing surfaces to be brought into even, level, and secure contact with each other ("intimate contact"), thereby preventing air gaps between surfaces and improving thermal performance. By making intimate contact between surfaces, thermal transfer is improved between the surfaces. In this way, more DUTs can be tested in parallel within a small test space, overall costs of the test system are reduced, and greater cooling capacity can be provided for testing high-powered devices. The test systems can include any suitable type of gimbaling mechanism featuring a single mount or multiple mounts which are disposed at various locations. The gimballing mounts can use screws and springs or other well-known fixing means that enable required freedom of movement in three dimensions.

According to some embodiments, gimbaled mounts are disposed on a bottom surface of individual socket interface boards (SIBS) of a test system. Each individual SIB can be gimbaled as necessary to achieve intimate contact with a respective cold plate (or thermo electric cooler) for efficient cooling. According to other embodiments, gimbaled mounts are disposed on top of individual thermal heads of a thermal array (TA) having a common cold plate (or having multiple cold plates). Screws on either side of the thermal head are used to re-center the thermal head, and springs disposed around the screws maintain the head level when not engaged with a socket. Test interface boards (TIBs) can be loaded into a handler that allows the TIBs to be received by an elevator for insertion into tester slots of the test system. Some embodiments of the present invention include self-actuated sockets (SAS) or parallel socket actuators (PSAs) that simultaneously activate all superstructures. According to some embodiments, both the socket interface boards and the thermal heads are gimballed so that their surfaces can be aligned correctly.

FIG. 1 depicts an exemplary tester 100 consisting of a low-cost thermal array (LCTA) 150 with its cold plate 110 and TECs 135. LCTA 150 is positioned above TIB 140. Between testing operations, the LCTA is normally lifted a few millimeters so that TIB 140 can be moved out to the handler/PSA, be fitted with untested DUTs, and brought back into the area under LCTA 150. FIG. 1 shows LCTA 150 after it has been lowered to create intimate contact with superstructure 120 which is part of TIB 140. TIB 140 contains one or more SIBs 145, each consisting of a superstructure 120, socket 125, and SIB circuit board (labeled "SIB"). Each SIB 145 is separately gimbaled using screws 115 and springs 130 with SIBs 145 that can gimbal in multiple directions ("float") using gimbal mounts 105 that fix SIBs 145 to test interface board (TIB) 140 according to embodiments of the present invention. In the example of FIG. 1, the DUT is installed in socket 125. The DUT, along with the electrical contacts located in the socket 125 beneath the DUT are both compressed by an interposer within superstructure 120 having smooth top and bottom surfaces fitted with thermal interface material (TIM). Alternatively, test system 100 can include self-actuated sockets with a flat top, according to some embodiments. When the TIB 140 is moved beneath LCTA 150 for DUT testing, cold plate 110 moves down approximately 2 mm (for instance) to force SIB 145 below the normal mounting height.

Multiple SIBs 145 with sockets can be mounted on a BIB (Burn-In Board) or TIB (Test Interface Board) 140. The SIBs can be mounted using specialized SIB mounts 105 in one or more locations to allow SIBs 145 to float/gimbal in three dimensions, thereby enabling intimate contact between thermo electric cooler (TEC) 135 coupled to cold plate 110 and superstructure 120 when thermal array 150 is actuated downward. Thermal array 150 can be brought into contact with self-actuating sockets or with socket superstructures that were previously actuated using a parallel socket actuator (PSA). In either case, the PSA simultaneously actuates all the superstructures prior to bringing the TIB into the vicinity of LCTA 150.

Gimbaling SIB mount 105 in accordance with embodiments of the present invention improves thermal performance by ensuring a close, intimate connection between the cold plate 110 surface and TEC 135 surface coupled to the superstructure/interposer, while at the same time reducing the cost and complexity of liquid cooling testing. According to some embodiments, a gimbaling SIB mount is disposed under a center portion of the SIBs. After testing is complete, thermal array 150 returns upward to its disengaged position. Spring 130 presses the SIBs against the tapered-head fasteners 115 for PSA operations. The SIBs can float/gimbal advantageously so that the PSA can align correctly with the SIBs. According to some embodiments, SIB 145 is gimballed and mounted to BIB 140 using a screw and spring disposed at each corner of the SIB 145. According to other embodiments, only three springs and three screws are used to mount the SIB.

Figure 2:
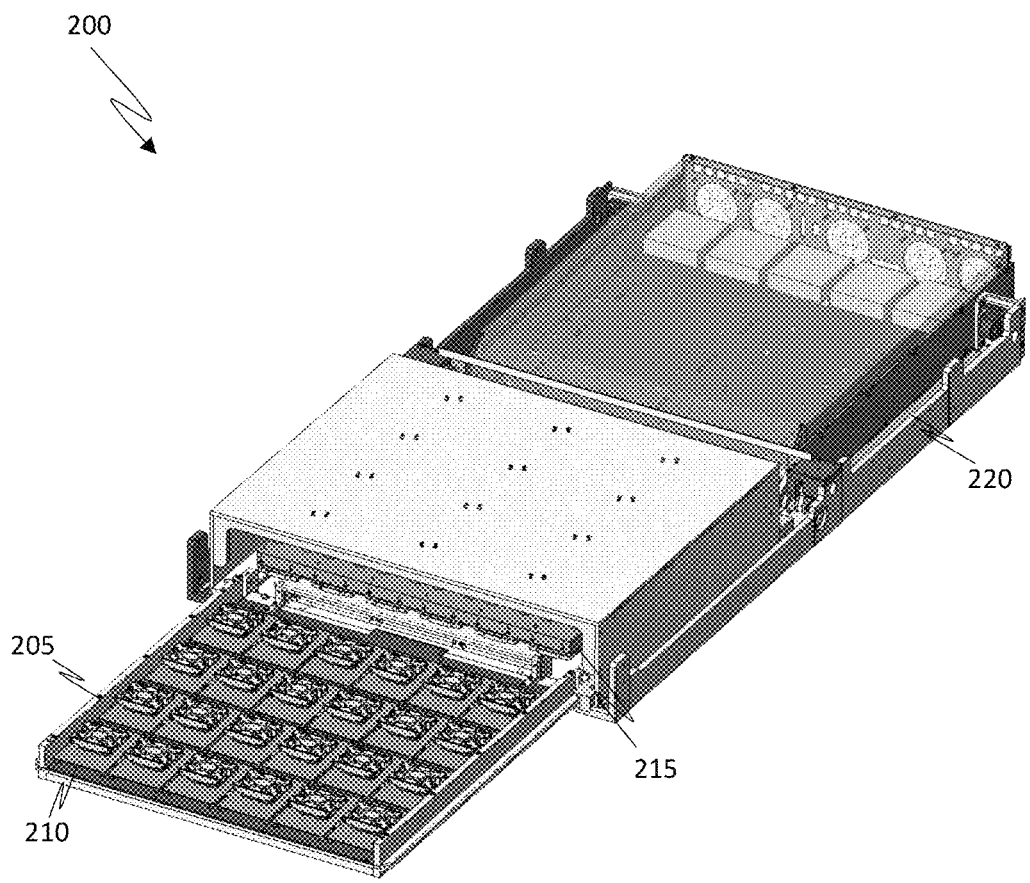
FIG. 2 is a diagram an exemplary system slot thermal array including SIBs that can gimbal in multiple directions using gimbal mounts disposed on the bottom side of thermal array according to embodiments of the present invention.

FIG. 2 is a diagram of an exemplary tester slot including a TIB mounted with SIBs that slides beneath a thermal array 200 fitted with cold plate 215. The cold plate can gimbal in multiple directions using gimbal mounts disposed on the bottom side of thermal array 200 according to embodiments of the present invention. In the example of FIG. 2, TIB 205 beneath thermal array 200 includes multiple SIBs 210 with SAS or PSA actuated sockets. The SIBs 210 are mounted to TIB 205 using specialized SIB mounts in multiple (e.g., 4) different locations on a bottom surface of SIBs 210 to allow SIBs 210 to float/gimbal in three dimensions for improved contact with cold plate 215 of thermal array 200. Thermal array 200 may be powered by system slot power delivery board (PDB) 220. The DUTS are disposed in the sockets of the SIBs 210.

Figure 3:
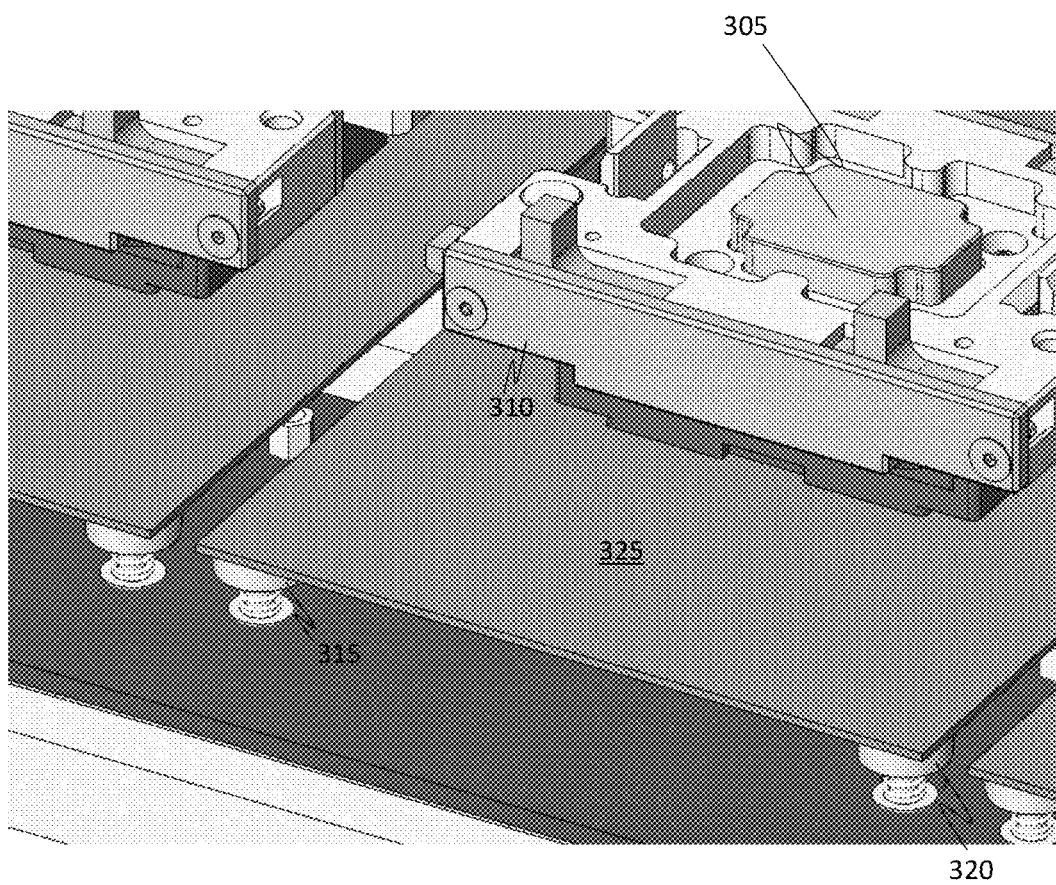
FIG. 3 is a diagram depicting a close view of an exemplary SIB, socket, and superstructure with gimbaling features shown according to embodiments of the present invention.

FIG. 3 is a diagram depicting a close view of an exemplary interposer 305 disposed within socket superstructure 310 and contacting a DUT during testing. The top side of interposer 305 is brought into contact with the TEC coupled to the cold plate. Gimbaling mounts 315 and 320 include a screw with a tapered head and optionally a spring for positioning interposer 305 into contact with the TEC. According to some embodiments, gimbaling mounts are disposed at all four corners of SIB 325.

Figure 4:
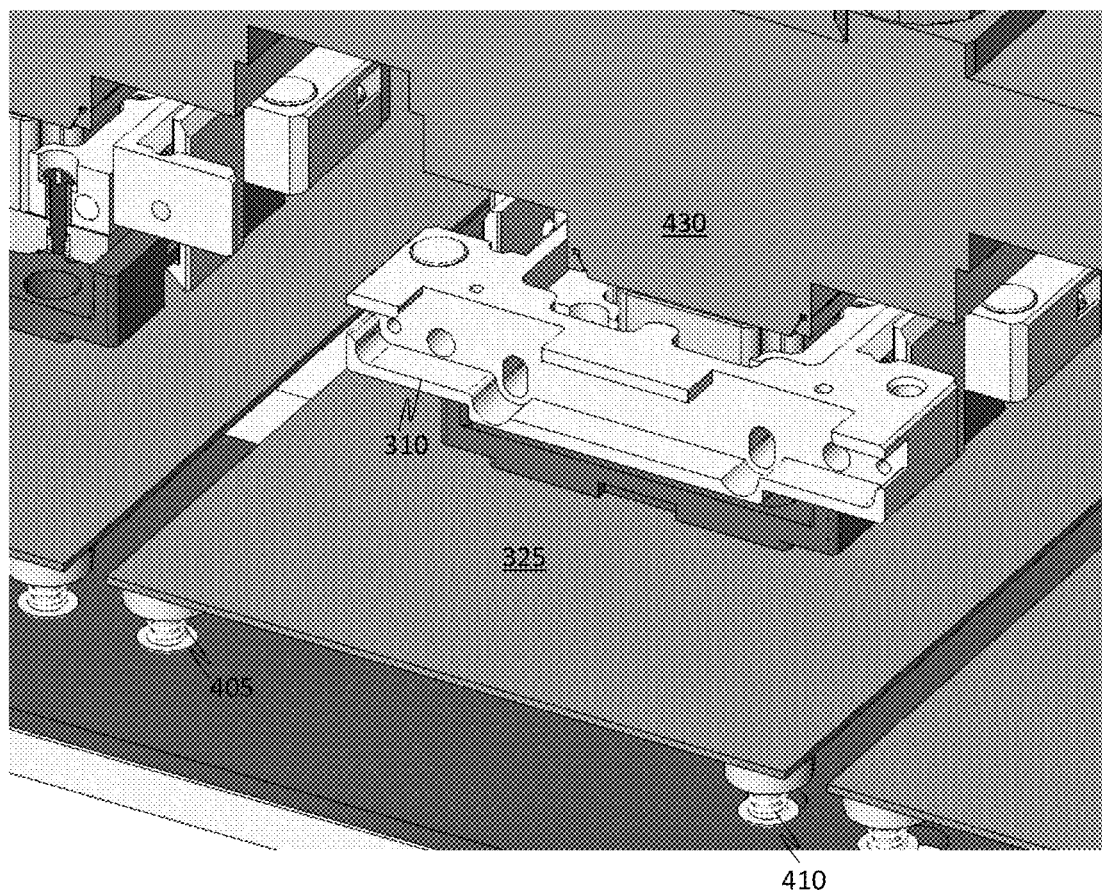
FIG. 4 is a diagram depicting a close view of an exemplary system slot thermal array with an engaged cold plate according to embodiments of the present invention.

According to some embodiments, a gimbaling mount is disposed beneath a central point of SIB 325. As depicted in FIG. 4, springs 405 and 410 are pressed down slightly during testing when superstructure 310 is brought into contact with cold plate 430, and allow SIB 325 to return to its normal position after the cold plate is lifted. The floating/gimbaling mounts 405 and 410 of SIB 325 enable the superstructure/interposer to evenly contact the TEC of cold plate 430 to improve cooling and efficiency.

Figure 5:
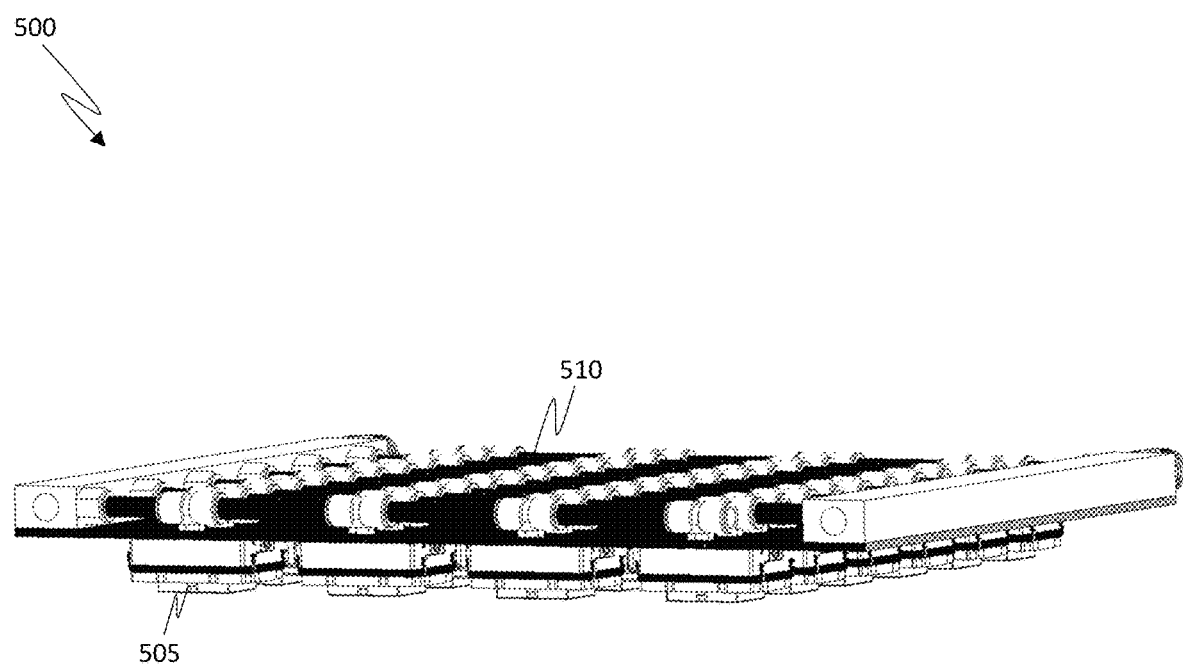
FIG. 5 depicts exemplary thermal array including thermal heads that can gimbal about a fixed point for improved cooling performance and efficiency according to embodiments of the present invention.

FIG. 5 depicts exemplary thermal array 500 including thermal heads 505 that can gimbal about a fixed point for improved cooling performance and efficiency according to embodiments of the present invention. In the example of FIG. 5, each thermal head has an independent gimbaling feature on the top side of thermal heads 505. In this way, the thermal heads evenly contact the superstructure containing the DUT during testing without any air gaps between the surface of the thermal head (e.g., cold plate) and the superstructure. Thermal array 500 is cooled by liquid cooling components 510.

Figure 6:
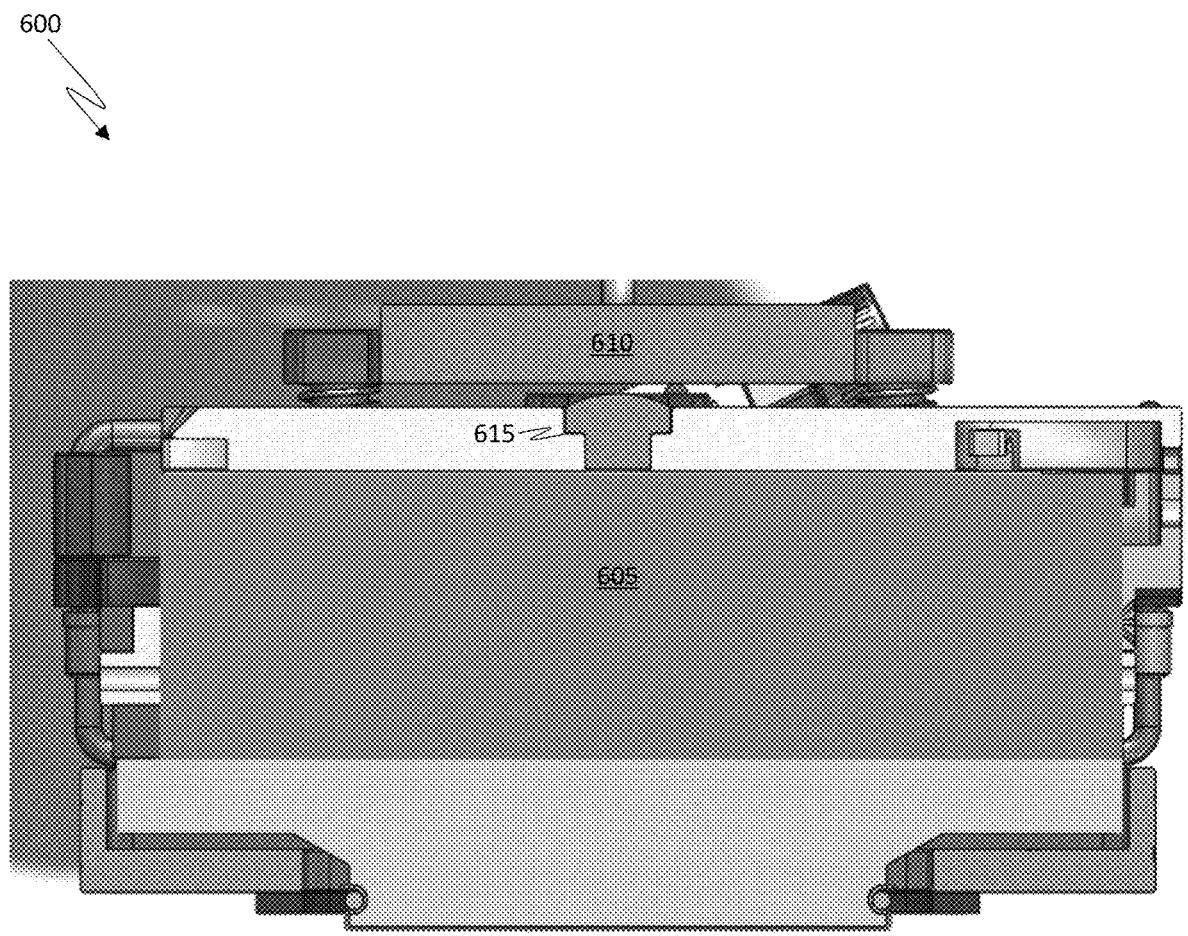
FIG. 6 depicts an exemplary gimbaled thermal head of a thermal array capable of independent gimbaling about a fixed mount to securely and evenly contact the corresponding superstructure/interposer for testing a DUT according to embodiments of the present invention.

FIG. 6 depicts an exemplary gimbaled thermal head 605 of a thermal array 600 capable of independent gimbaling about a fixed mount 610 so that thermal head 605 securely and evenly contacts the surface of the corresponding superstructure/interposer for testing a DUT according to embodiments of the present invention. The thermal head 605 can be moved/rotated about fixed mount 610 that secures thermal head 605 to the tray of the test system. In the example of FIG. 6, thermal head 605 pivots about a dome-shaped fixture to improve cooling and efficiency by ensuring proper alignment between surfaces and preventing any air gaps between them. A screw or similar fastener is used to re-center thermal head and a spring surrounding the screw us used to keep the head level when not engaged.

Figure 7:
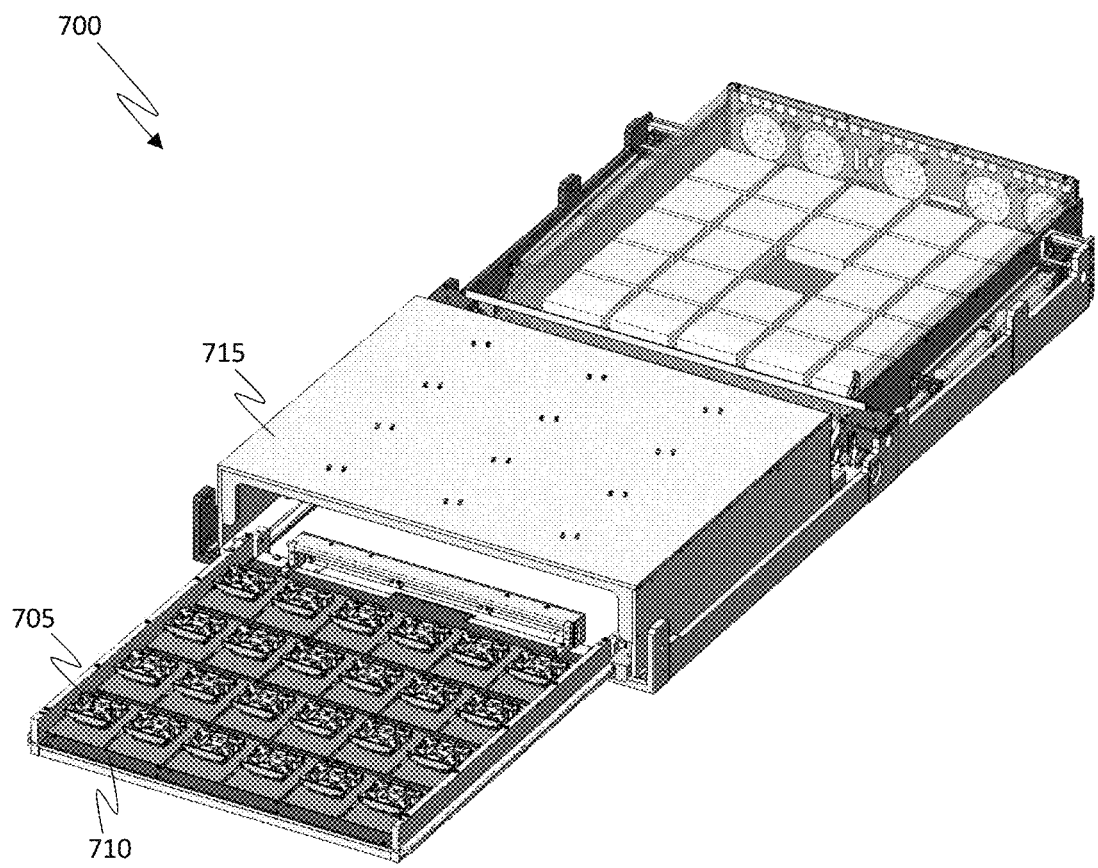
FIG. 7 depicts an exemplary testing system including a slot thermal array with individual gimbaling actuation heads for securely and evenly contacting superstructures of the TIB according to embodiments of the present invention.

FIG. 7 depicts an exemplary system slot thermal array 700 with individual gimbaling actuation heads for securely and evenly contacting superstructures 705 of test interface board 710 according to embodiments of the present invention. The testing system 700 includes a system slot power delivery board to power the BIB/SIBs/DUTs, and in some embodiments, it also powers the thermal array 700 during testing to provide powerful and efficient cooling to DUTs of test interface board 710 using one or more cold plates. The thermal heads of thermal array 700 can pivot about a fixed point to bring the cold plate surface into even and secure contact with superstructures 705 of test interface board 710 for DUT testing.

Figure 8:
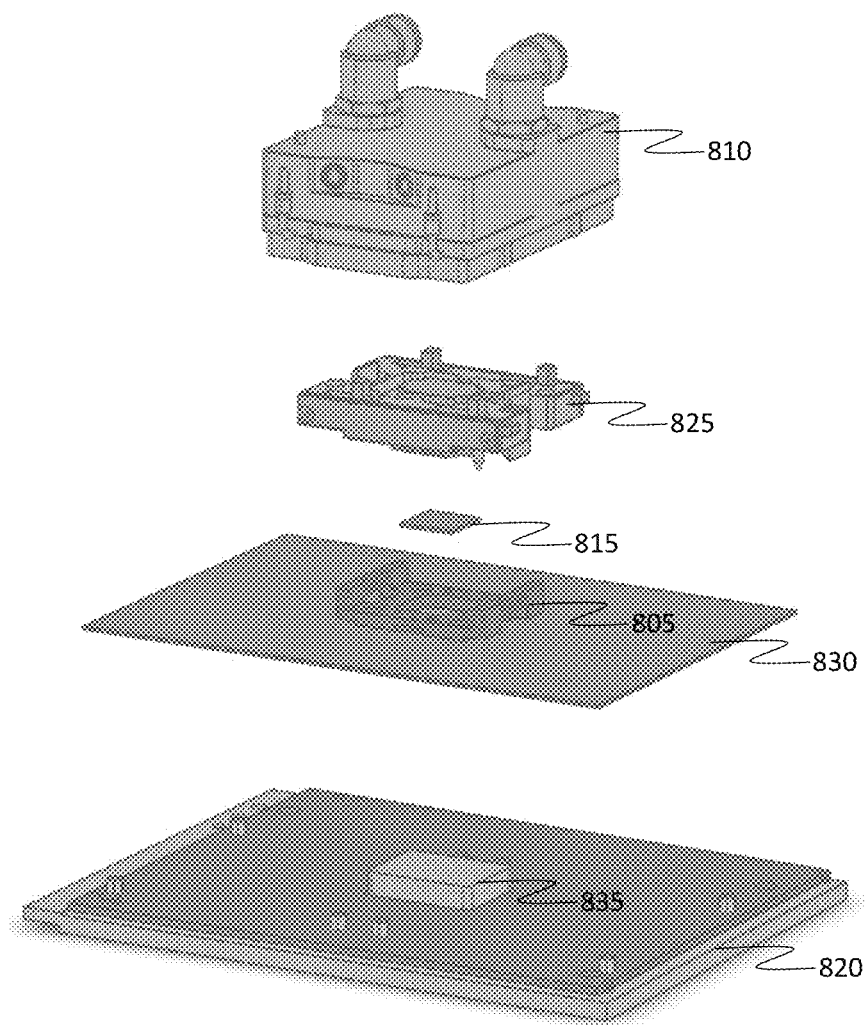
FIG. 8 depicts an exploded view of an exemplary actuated socket and gimbaling thermal head for cooling a DUT according to embodiments of the present invention.
Figure 9:
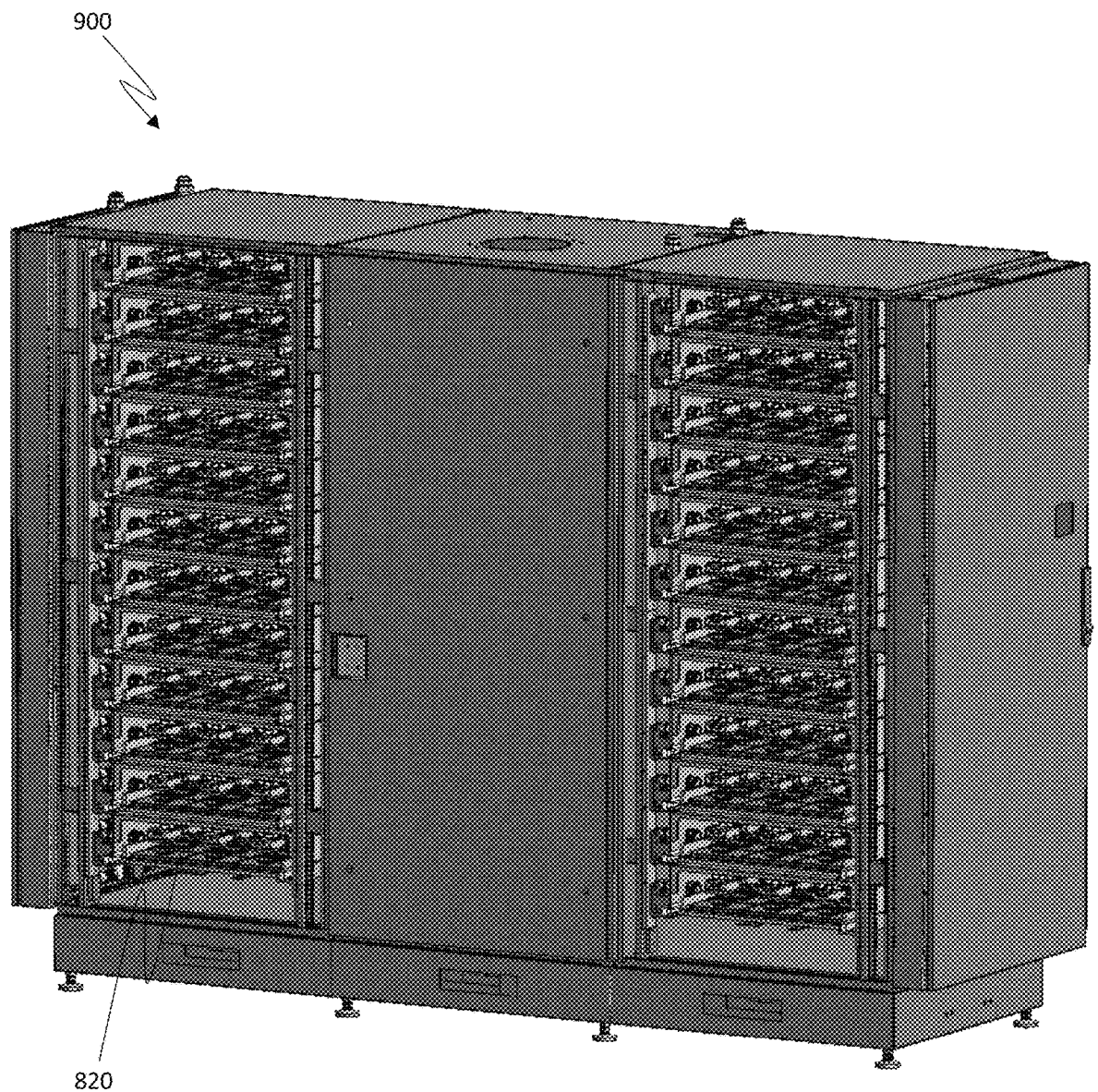
FIG. 9 depicts 24 exemplary test interface boards (TIBs) loaded into tester according to embodiments of the present invention.

FIG. 8 depicts an exemplary actuated socket 805 and gimbaling thermal head 810 for cooling DUT 815 according to embodiments of the present invention. DUT 815 is disposed in socket 805 of socket interface board 830. Test interface board 820 includes TIB support block 835 for supporting slot interface board 830. Thermal head 810 can be gimbaled about a fixed point to provide secure and even contact with superstructure 825 (or an interposer thereof). Superstructure 825 can be a self-actuating socket or can be actuated by a PSA, for example. As depicted in FIG. 9, test interface board 820 can be loaded into tester 900 and connected to a tester slot for testing.

Figure 10:
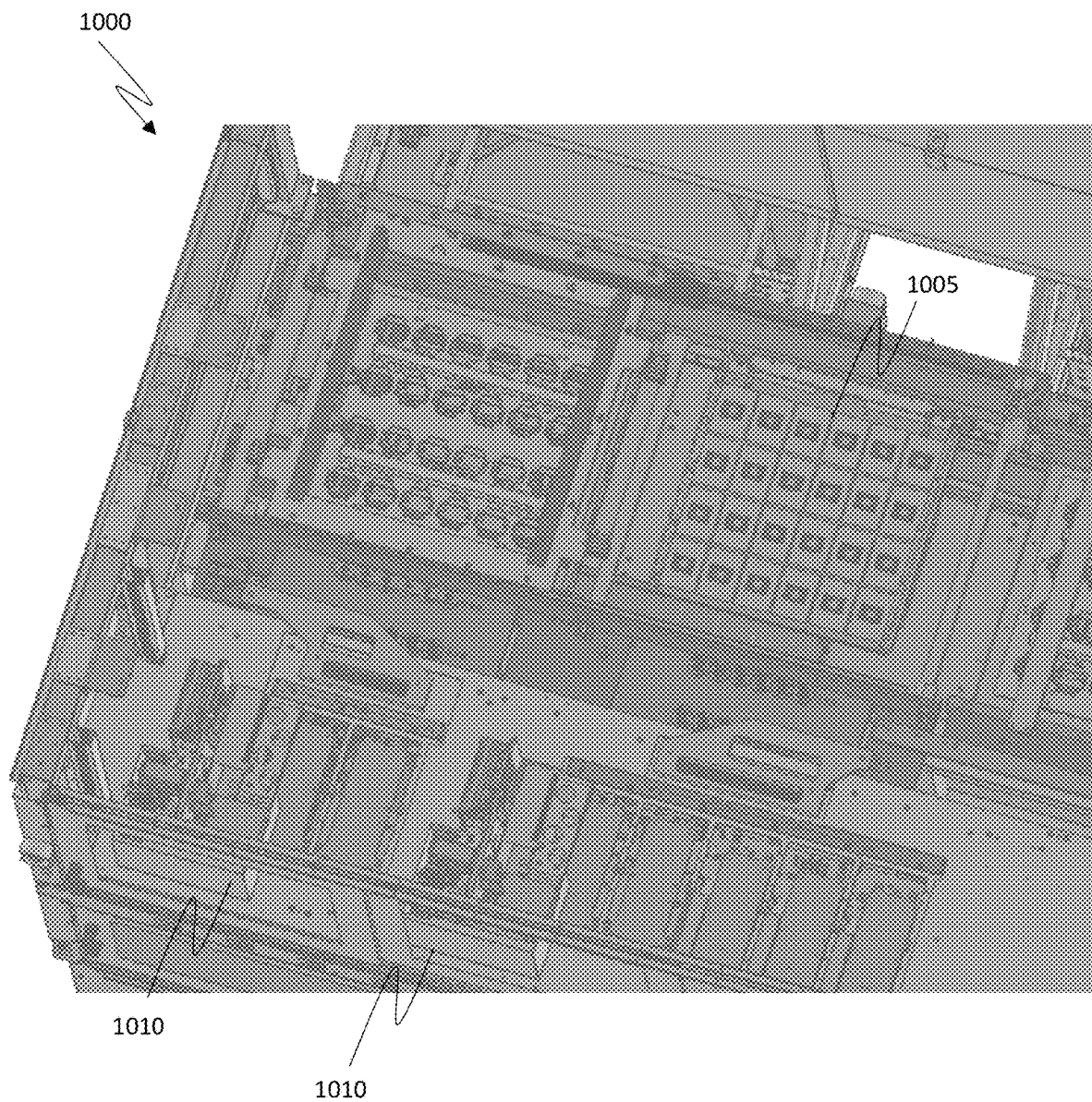
FIG. 10 depicts an exemplary tester including a test interface board ready for DUT dropping according to embodiments of the present invention.

FIG. 10 depicts an exemplary tester 1000 including a test interface board 1005 ready for DUT dropping according to embodiments of the present invention. Handler pick and place heads 1010 and 1010 transfer the DUTs from/to the TIB 1005 and the DUT trays. Test interface board 1005 can include SAS or PSA sockets, for example.

Figure 11:
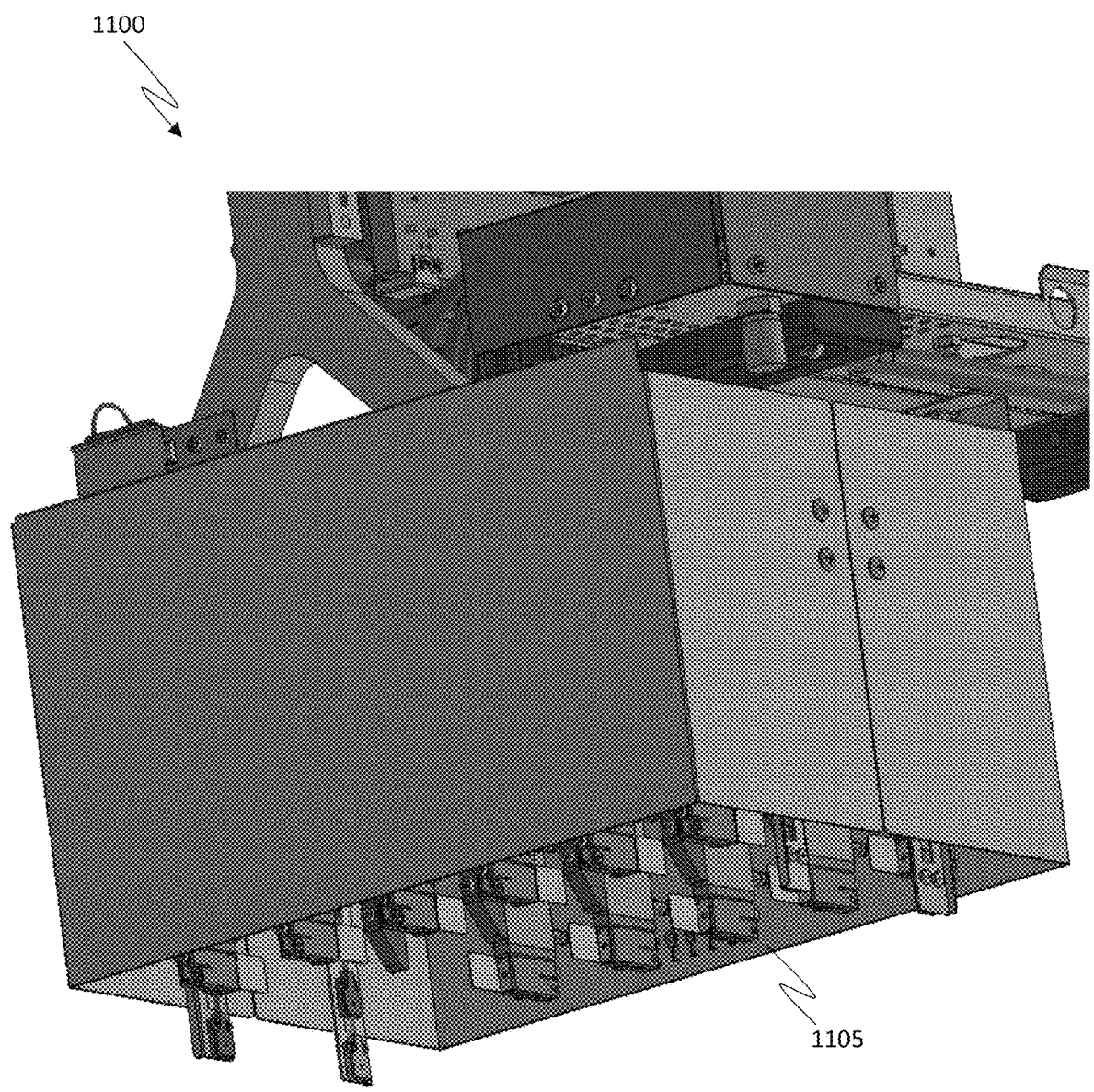
FIG. 11 depicts an exemplary handler for loading a test interface board according to embodiments of the present invention.
Figure 12:
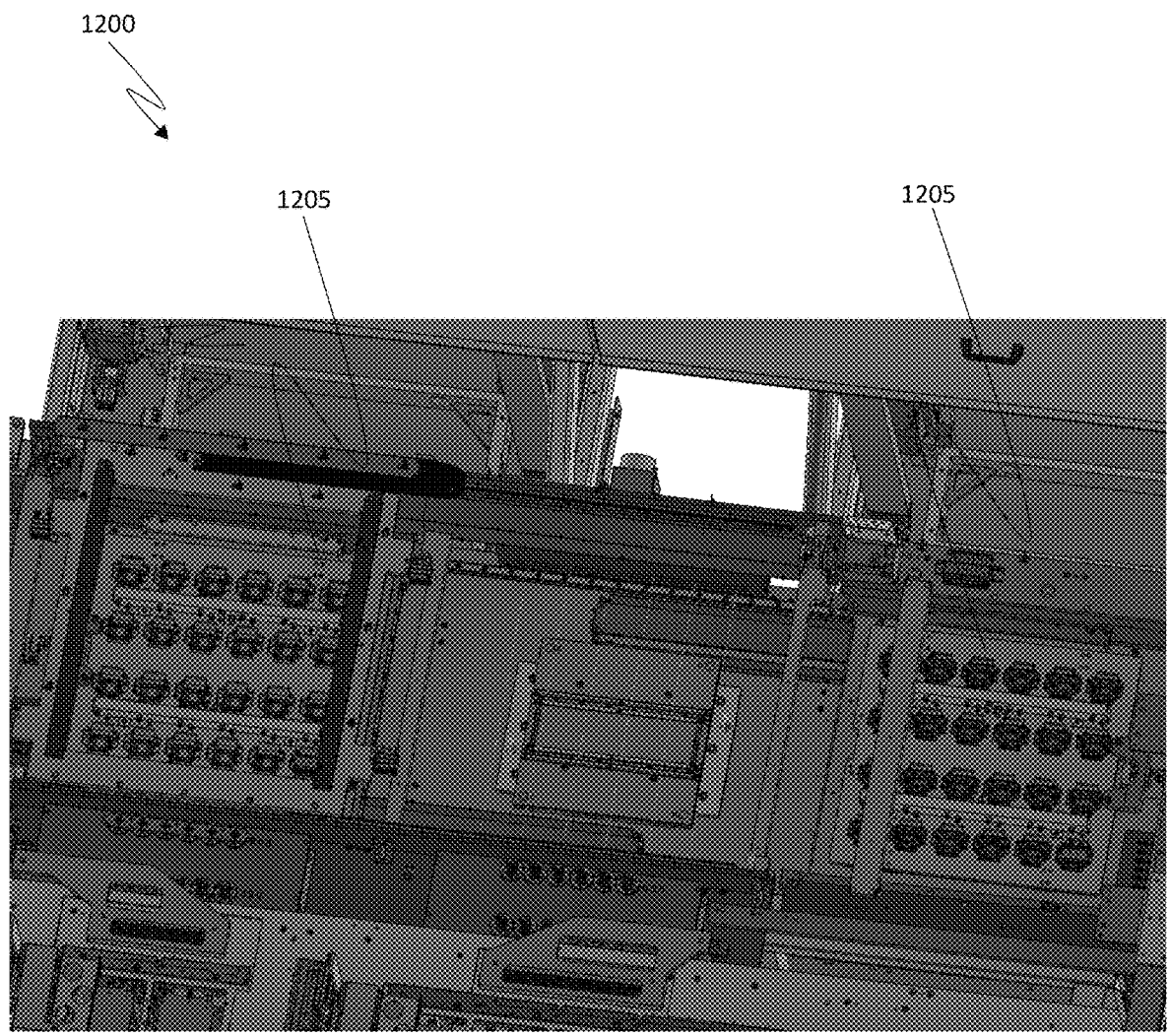
FIG. 12 depicts an exemplary PSA system disposed within a handler according to embodiments of the present invention.
Figure 13:
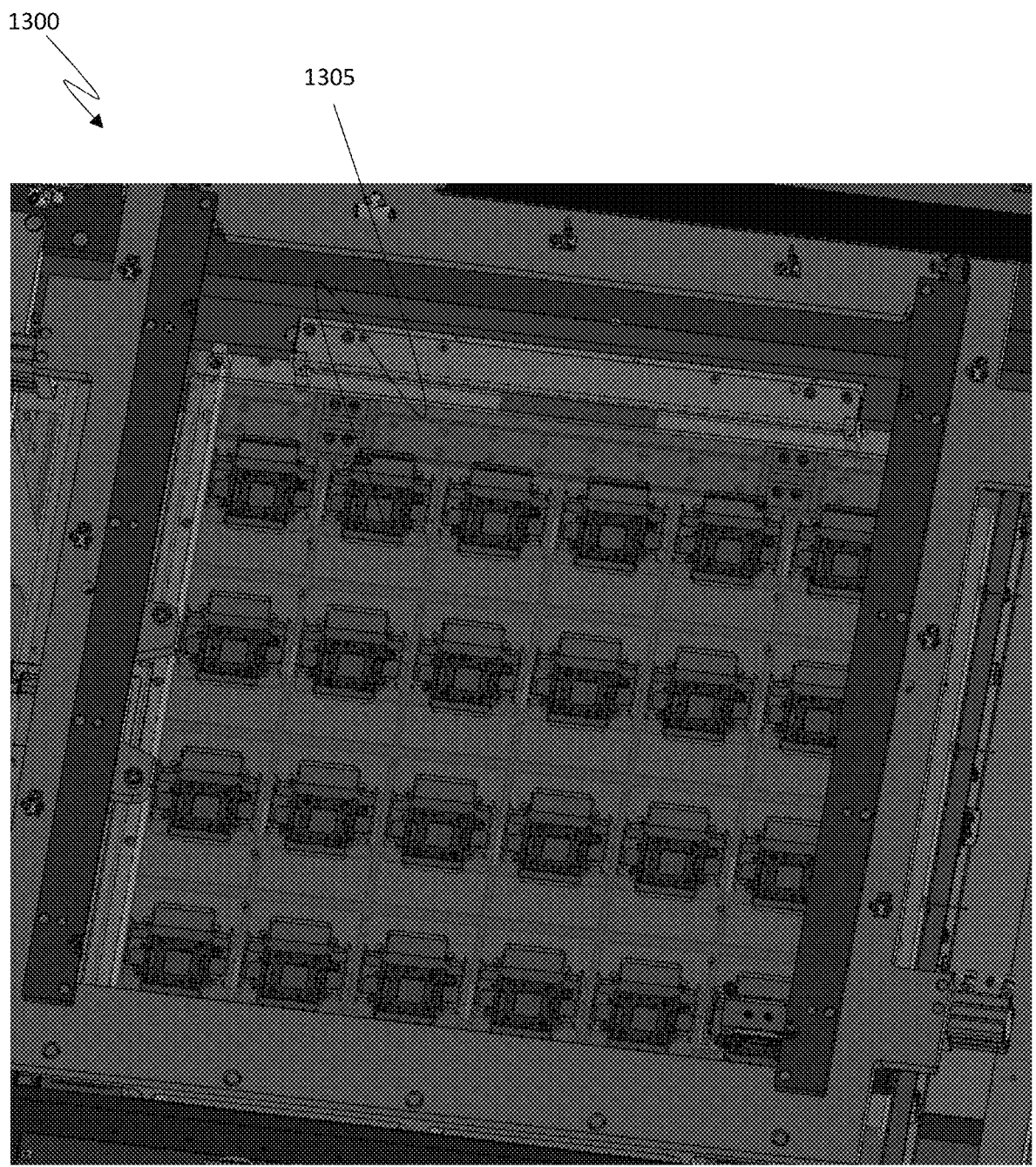
FIG. 13 depicts an exemplary test interface board under a PSA system for superstructure dropping and actuation according to embodiments of the present invention.
Figure 14:
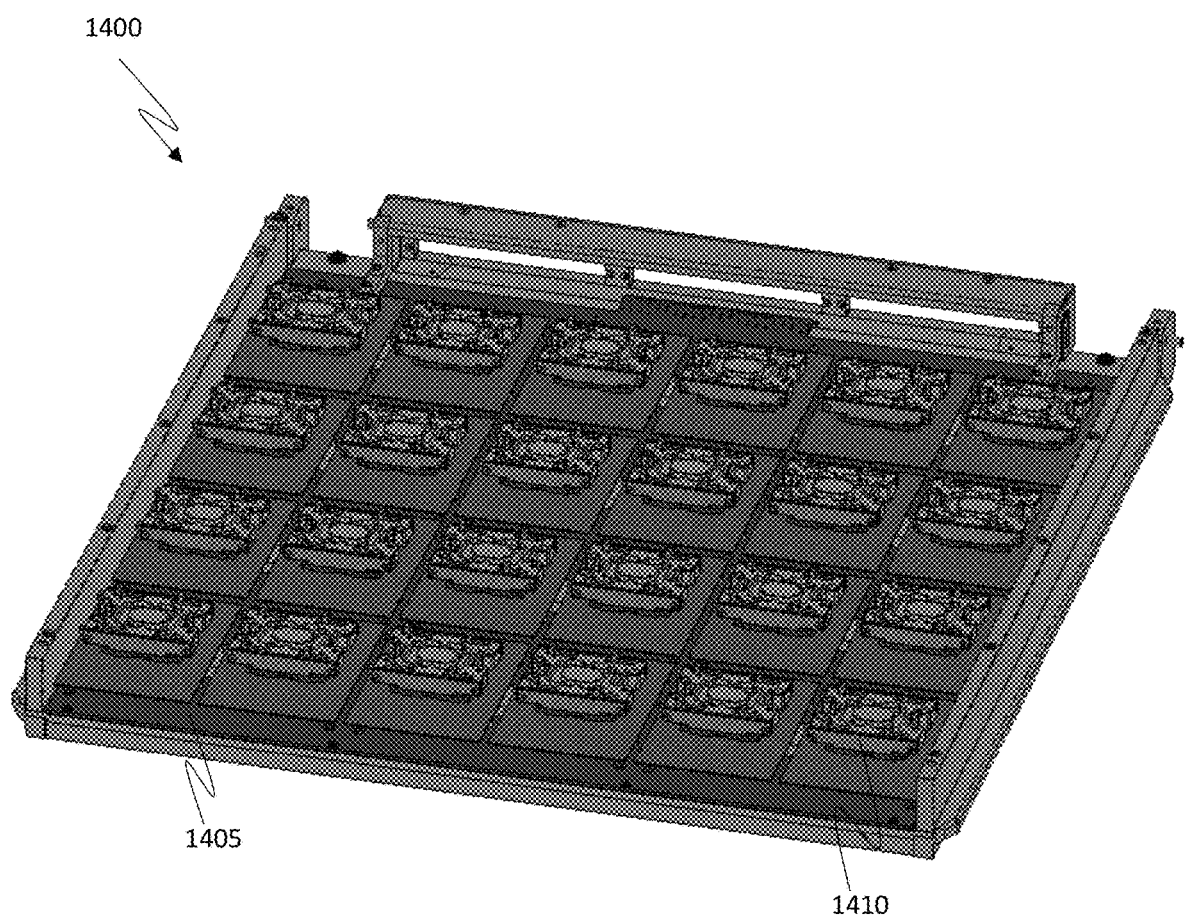
FIG. 14 depicts an exemplary test interface board ready for slot installation according to embodiments of the present invention.
Figure 15:
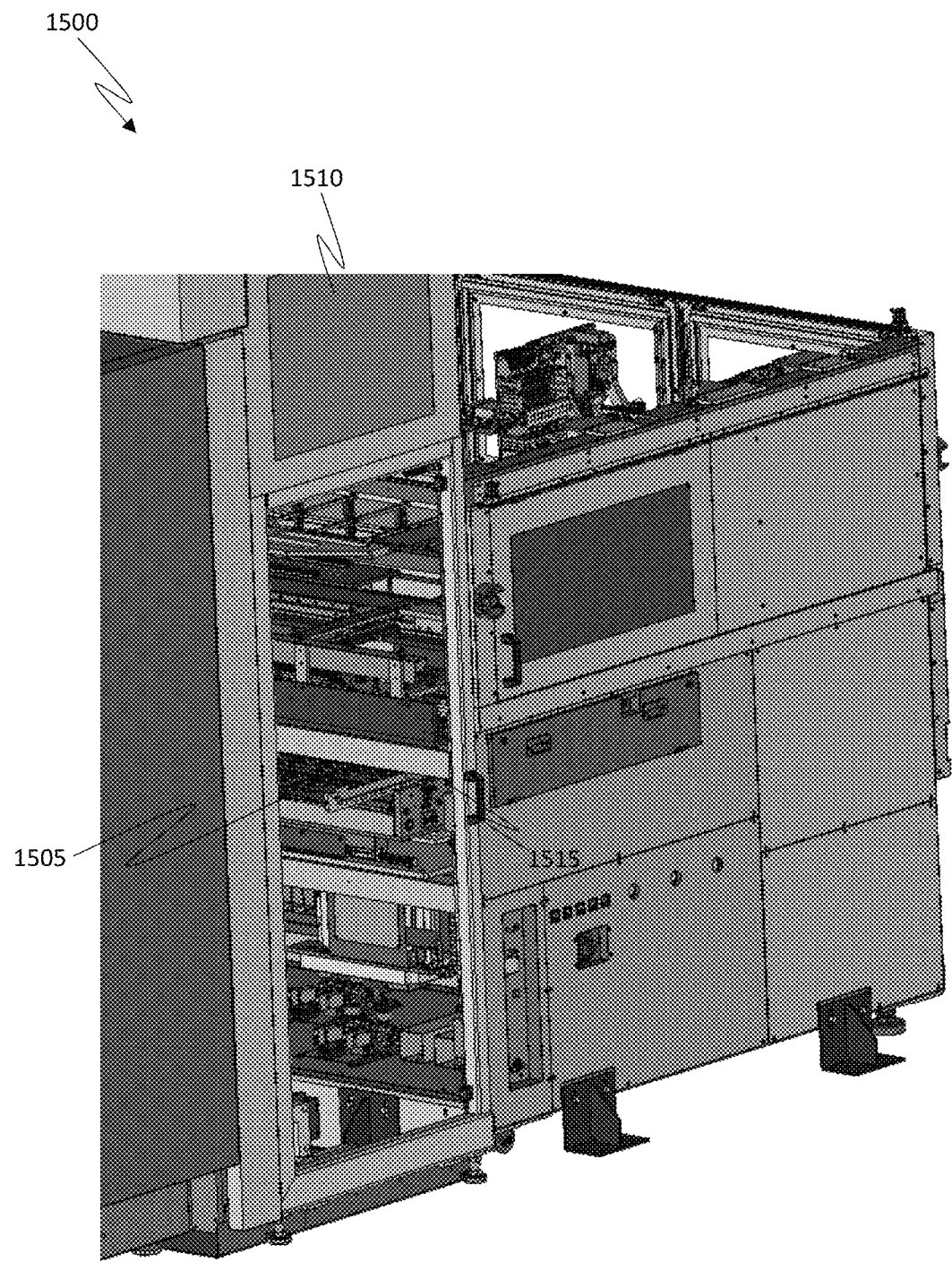
FIG. 15 depicts an exemplary test interface board loaded into an elevator for insertion into a slot tester according to embodiments of the present invention.

FIG. 11 depicts the individual DUT pick heads 1105 on the underside of a handler pick and place head 1100. Each pick head can pick up one DUT. FIG. 12 depicts an exemplary PSA system 1205 disposed within a handler according to embodiments of the present invention. FIG. 13 depicts a bottom side of exemplary test interface board 1300 under a PSA system 1305 for superstructure dropping and actuation according to embodiments of the present invention. FIG. 14 depicts an exemplary test interface board 1405 ready for slot installation according to embodiments of the present invention. The sockets of test interface board 1405 are actuated using super structures 1410. FIG. 15 depicts an exemplary test interface board 1505 loaded into an elevator 1510 for insertion into slot tester 1515 according to embodiments of the present invention.

Exemplary Test System

Embodiments of the present invention are drawn to electronic systems for device testing using liquid cooled thermal arrays (or refrigerant cooled thermal arrays) with gimbaling features to enable secure and even alignment and contact between a DUT, superstructure, or interposer, with a cold plate, heater, active thermal interface, or TEC disposed thereon. The socket that receives the DUT can be a self-actuating socket or a parallel actuation socket. The gimbaling features can be implemented using tapered screws and springs, for example.

According to some embodiments, the gimbaling features (e.g., mounts) are located on the bottom of the socket interface board to allow the socket interface board to pivot freely in three dimensions. According to some embodiments, the gimbaling features are located on top of the thermal head to allow the thermal head to pivot freely in three dimensions. According to other embodiments, both the socket interface board (or test interface board) and thermal head can gimbal about fixed points as described above according to embodiments of the present invention.

Figure 16:
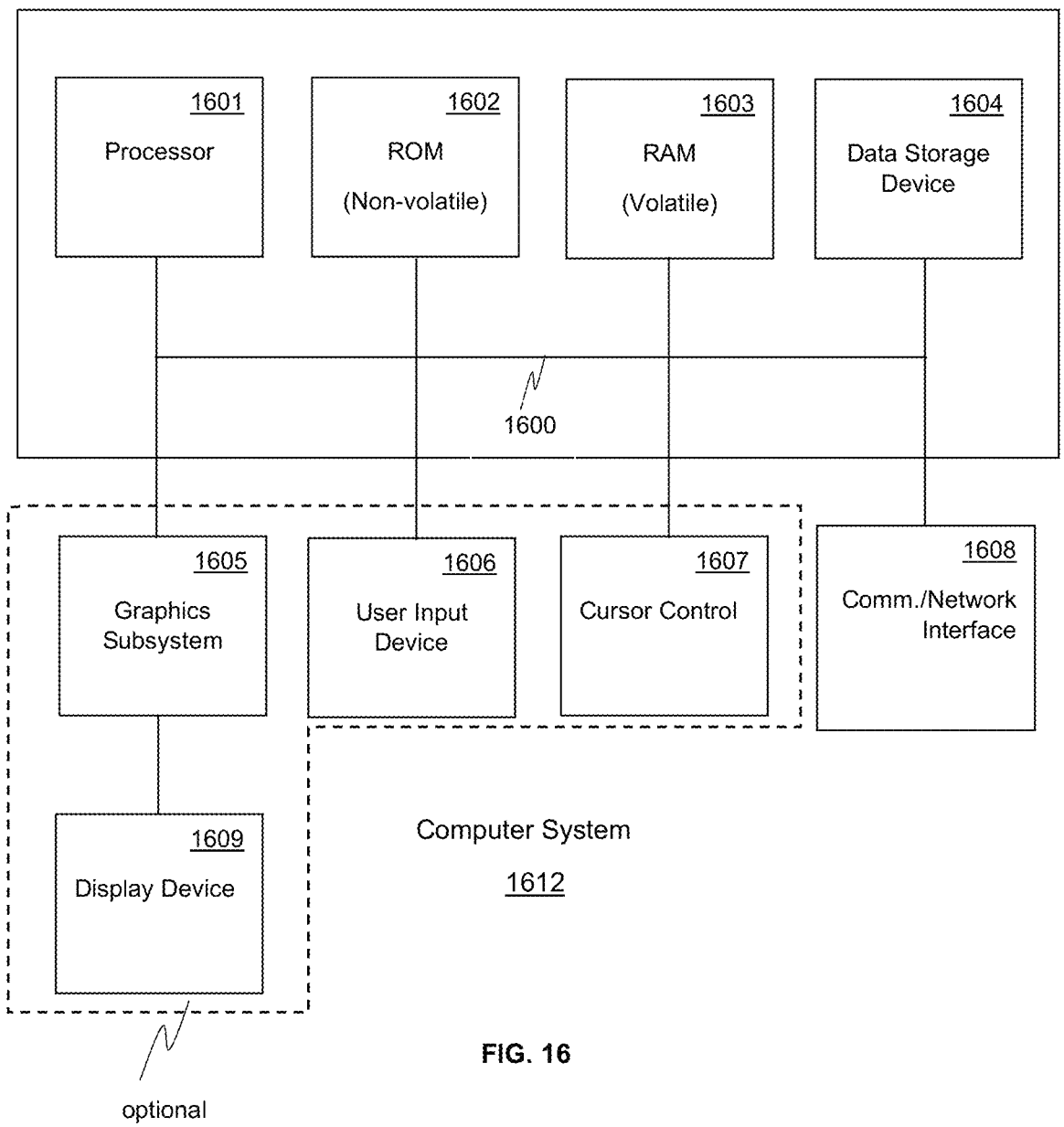
FIG. 16 depicts an exemplary computer platform upon which embodiments of the present invention may be implemented.

In the example of FIG. 16, the exemplary computer system 1612 includes a central processing unit (CPU) 1601 for running software applications and an operating system. Read-only memory 1602 and random access memory 1603 store applications and data for use by the CPU 1601. Data storage device 1604 provides non-volatile storage for applications and data and may include fixed disk drives, removable disk drives, flash memory devices, and CD-ROM, DVD-ROM or other optical storage devices. The data storage device 1604 or the memory 1602/1603 can store historic and real-time testing data (e.g., test results, limits, computations, etc.). The optional user inputs 1606 and 1607 comprise devices that communicate inputs from one or more users to the computer system 1612 (e.g., mice, joysticks, cameras, touch screens, keyboards, and/or microphones). A communication or network interface 1608 allows the computer system 1612 to communicate with other computer systems, networks, or devices via an electronic communications network, including wired and/or wireless communication and including an Intranet or the Internet.

The optional display device 1609 may be any device capable of displaying visual information, e.g., the final scan report, in response to a signal from the computer system 1612 and may include a flat panel touch sensitive display, for example. The components of the computer system 1612, including the CPU 1601, memory 1602/1603, data storage 1604, user input devices 1606, and graphics subsystem 1605 may be coupled via one or more data buses 1600.

Tension Based Gimbaling Socket for DUT Testing

Figure 17:
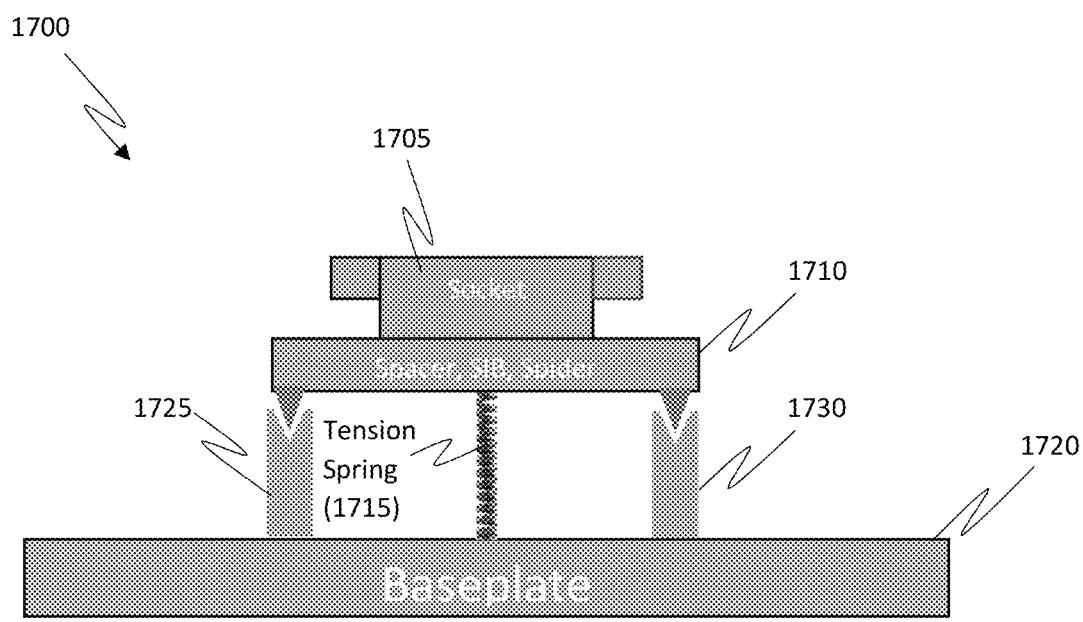
FIG. 17 depicts an exemplary gimbaling socket structure that uses tension to bring a DUT disposed in the socket into secure contact with a liquid cooled thermal array or the like to cool the DUT during testing according to embodiments of the present invention.

FIG. 17 depicts an exemplary gimbaling socket structure 1700 that uses tension (rather than compression) to bring a DUT disposed in socket 1705 into secure contact with a liquid cooled thermal array or the like to cool the DUT during testing according to embodiments of the present invention. The gimbaling socket structure 1700 is secured to a tension spring 1715 and can move freely in 3 dimensions to bring the surfaces of the DUT and the thermal array (or components thereof, such as TEC/ATI layers) into even, level, and secure contact with each other ("intimate contact"), thereby preventing air gaps between surfaces and improving thermal performance. The tension spring also helps keep the socket seated during operation and when transported between the handler and the test system 1700. The even, secure contact between surfaces provided by gimbaling socket structure 1700 improves thermal cooling and reduces variation in cooling efficiency. Advantageously, more DUTs can be tested in parallel within a small test space, overall costs of the test system are reduced, and greater cooling capacity can be provided for testing high-powered devices.

In the example of FIG. 17, socket 1705 is disposed on a SIB stack 1710 that typically includes a support block ("spider") and/or a spacer to bring the socket 1705 into the correct position, and to support the DUT disposed in socket 1705 during testing. Tension spring 1715 is attached to the bottom of the SIB stack 1710 and to baseplate 1720 to pull downward on SIB stack 1710 so that the entire structure, including socket 1705, rests on support pillars 1725 and 1730. Support pillars 1725 and 1730 can include a notch or a groove that accommodates a corresponding member disposed on the bottom of the SIB stack to help secure the SIB stack while in its rest position. Baseplate 1720 can be a BIB, TIB, or the like. To engage a DUT disposed in socket 1705 with a liquid cooled thermal array or other cooling system, socket 1705 and SIB stack 1710 are lifted away from support pillars 1725 and 1730 and pulled upward allowing the structure to gimbal (e.g., tilt, pivot, etc.) freely when bringing the DUT disposed in socket 1705 into contact with a cold plate, thermal array, etc. According to some embodiments, the baseplate (e.g., BIB) can slide underneath the thermal array on a tray to engage a corresponding connector of the PBD. Electrical power flows through the connection to power the SIBs and the DUTs during operation.

Figure 18:
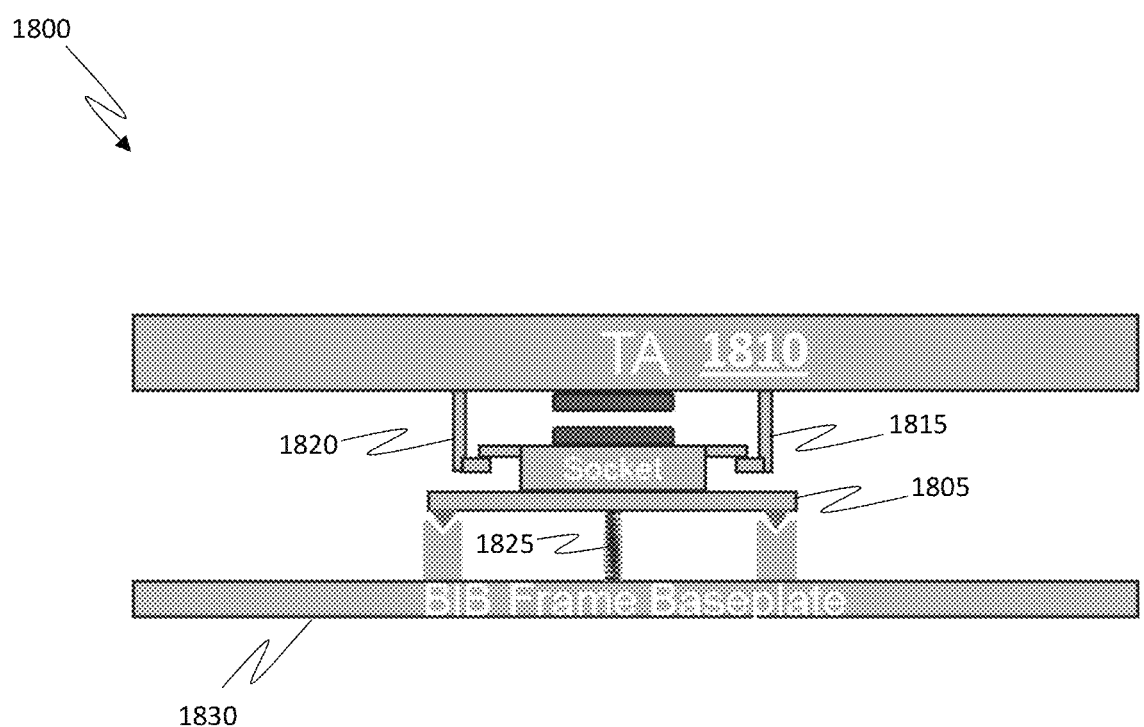
FIG. 18 depicts an exemplary gimbaling socket structure, thermal array, and arms that lift the gimbaling socket structure into position and bring a DUT disposed therein into intimate contact with a thermal array according to embodiments of the present invention.

FIG. 18 depicts an exemplary test system 1800 including a gimbaling socket structure 1805, a thermal array 1810, and arms ("grabber arms") 1815 and 1820 that lift gimbaling socket structure 1805 into position and bring a DUT disposed therein into intimate contact with thermal array 1810 according to embodiments of the present invention. Gimbaling socket structure 1805 is connected to BIB frame baseplate 1830 by a tension spring 1825 that allows the gimbaling socket structure 1805 to pivot/rotate about the spring for making flush, secure contact with thermal array 1810 to improve cooling performance. Tension spring 1825 provides sufficient downward force to ensure that the socket stays seated when in position for testing or when transported between the handler to the test system 1800.

To engage the DUT disposed in gimbaling socket structure 1805 with the thermal array (or components thereof), grabber arms 1815 and 1820 pull the gimbaling socket structure 1805 upward, which increases the tension of spring 1825 compared to its initial resting position. The grabber arms 1815 and 1820 can be moved using an air piston or another pressurized force, for example. According to some embodiments, 90 pounds per square inch of air pressure is provided by an air actuator through a cross sectional area of 1-2 square inches at 180 lbf.

When grabber arms 1815 and 1820 release gimbaling socket structure 1805, the tension spring 1825 pulls the gimbaling socket structure 1805 back down to its resting position. Tensions spring 1825 typically provides a downward force of 1-3 lbf, although springs having more or less tension may be suitable. In this way, gimbaling socket structure 1805 can be quickly and easily brought into position for testing, and can be lowered back down to its resting position after testing to replace the DUT, for example. In the example of FIG. 18, the gimbaling socket structure 1805 and the thermal array 1810 include optional thermal pads/material (e.g., TEC or ATI) to increase heat transfer for improved cooling.

Figure 19:
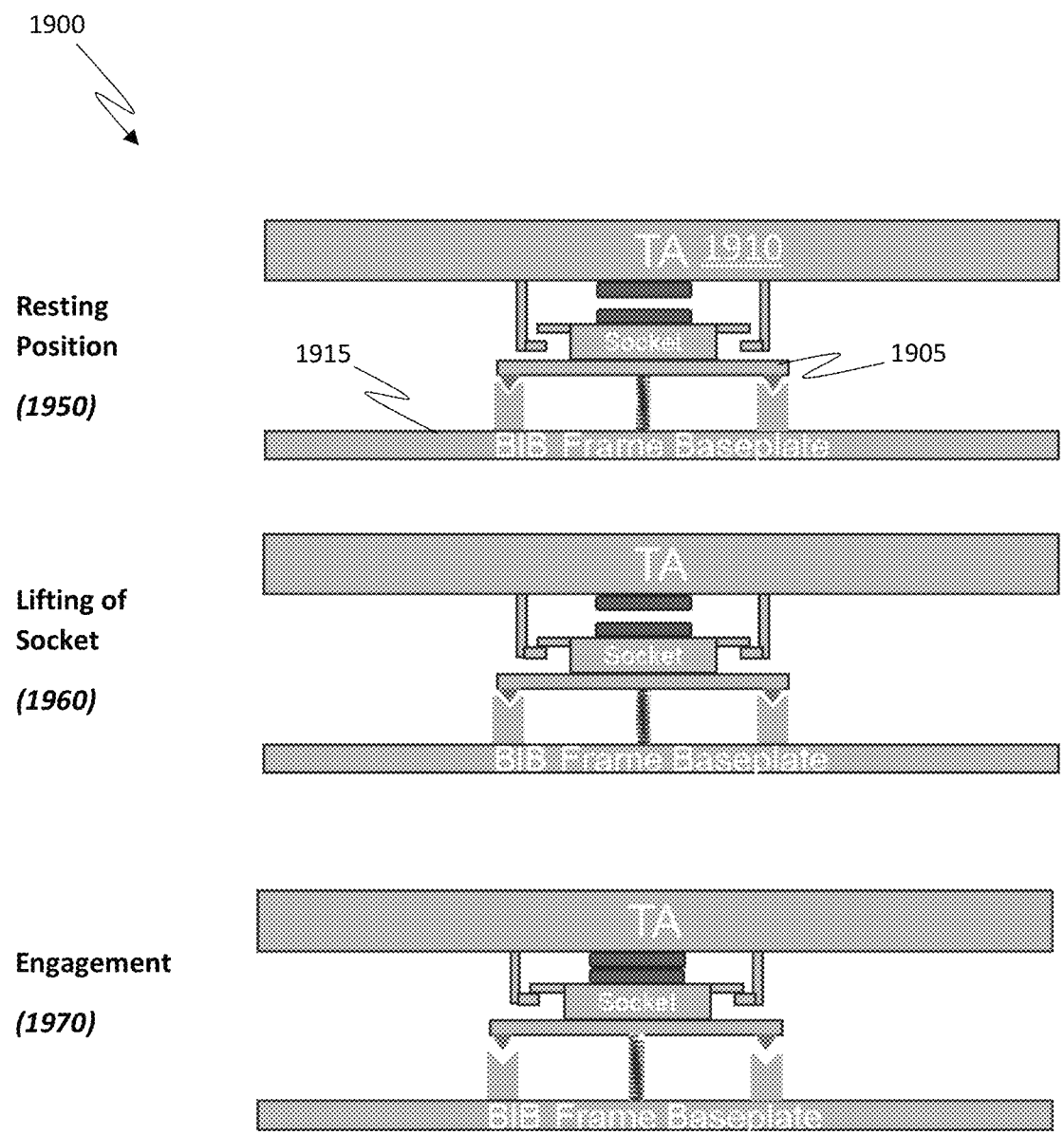
FIG. 19 depicts exemplary positions of a gimbaling socket for engaging and disengaging the socket structure with a thermal array according to embodiments of the present invention.

FIG. 19 depicts exemplary gimbaling socket positions 1900 for engaging and disengaging a gimbaling socket structure 1905 with a thermal array 1910 according to embodiments of the present invention. In resting position 1950, gimbaling socket structure 1905 includes a socket disposed on a SIB that is pulled downward by a tension spring and rests on support pillars of BIB frame baseplate 1915. According to some embodiments, instead of using a tensions spring, gimbaling socket structure 1905 is pulled downward by another force, such as gravitational force or a pressure differential/vacuum, for example.

In position 1960, the gimbaling socket structure 1905 is contacted by the grabber arms of thermal array 1910. The grabber arms can be moved (and cause the gimbaling socket structure 1905 to move) using pressurized air or the like.

In position 1970, the gimbaling socket structure 1905 is lifted off of the support pillars of BIB frame baseplate 1915 and brought into intimate contact with thermal array 1910. Advantageously, gimbaling socket structure 1905 is able to rotate/pivot freely when contacting thermal array 1910 to ensure that contact between the socket 1905 and the thermal array 1910 is level and even. In this way, thermal management is improved and any gaps, air bubbles, or the like are substantially mitigated or prevented entirely. The spring continues to provide downward force to keep gambling socket structure 1905 seated in the correct position. To disengage gimbaling socket structure 1905 from thermal array 1910, the reverse process is performed, and the grabber arms and the socket structure 1905 are lowered down to their rest position under the tension of the spring.

Figure 20:
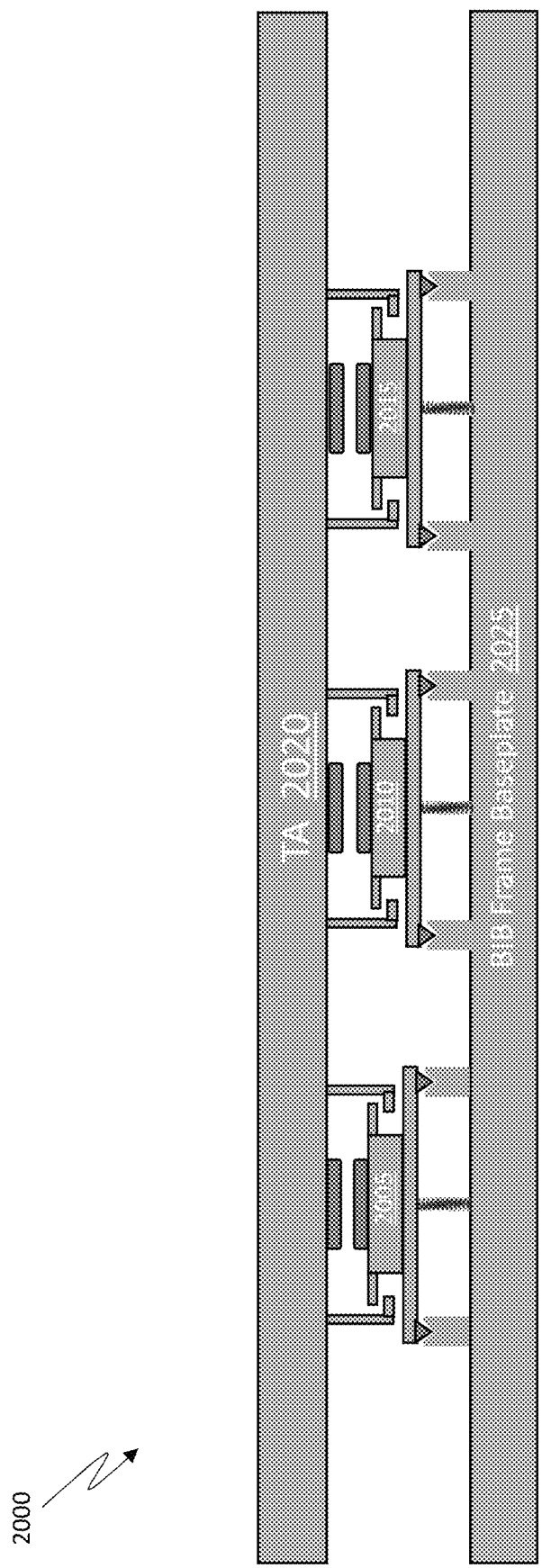
FIG. 20 depicts an exemplary test array including a row of exemplary gimbaling socket structures disposed on a common baseplate and cooled by a common thermal array according to embodiments of the present invention.

FIG. 20 depicts an exemplary test array 2000 including a row of exemplary gimbaling socket structures 2005, 2010, and 2015 disposed on a common baseplate 2025 and cooled by a common thermal array 2020 according to embodiments of the present invention. Each gimbaling socket structure 2005, 2010, and 2015 is able to gimbal freely connected to its own tension spring to ensure solid, level contact between the DUTs disposed in gimbaling socket structures 2005, 2010, and 2015 and the thermal array 2020 when engaged and operating. In this way, the DUTs can be cooled more effectively, and testing performance is improved. According to some embodiments, test system 2000 includes multiple rows of gimbaling socket structures that be used to test multiple DUTs in parallel.

Figure 21:
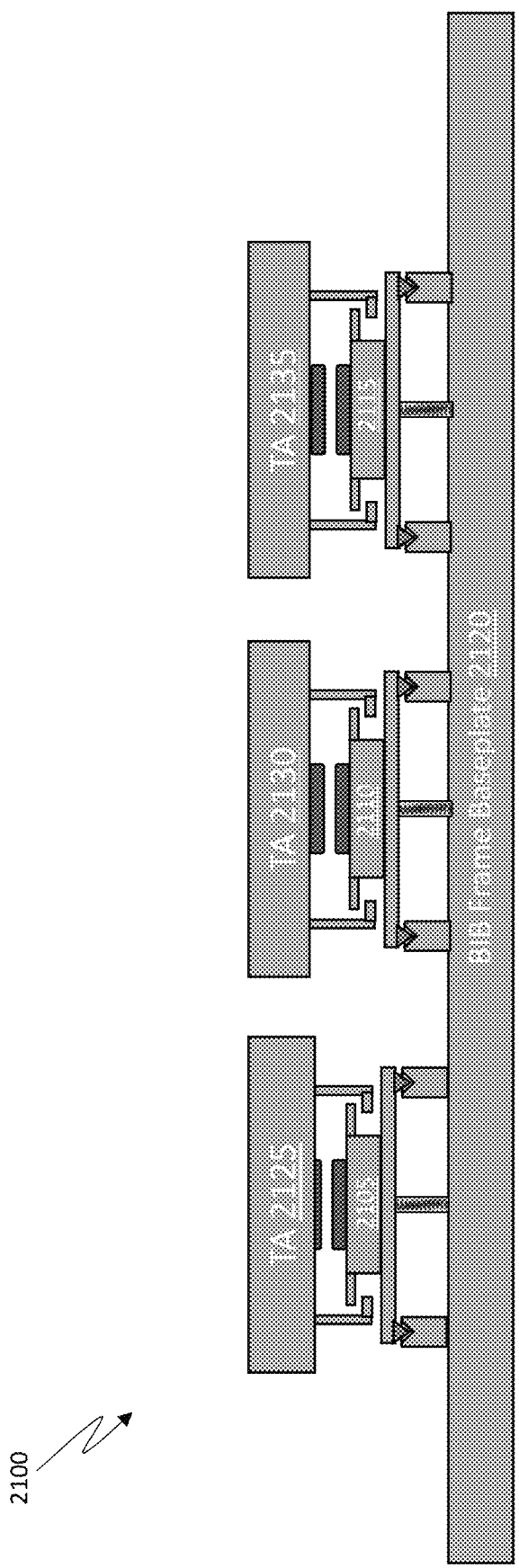
FIG. 21 depicts an exemplary test array including a row of exemplary gimbaling socket structures disposed on a common baseplate and cooled by individual thermal arrays according to embodiments of the present invention.

FIG. 21 depicts an exemplary test array 2100 including a row of exemplary gimbaling socket structures 2105, 2110, and 2115 disposed on a common baseplate 2120 and cooled by individual thermal arrays 2125, 2130, and 2135 according to embodiments of the present invention. Each gimbaling socket structure 2105, 2110, and 2115 is able to gimbal freely connected to its own tension spring to ensure solid, level contact between the DUTs disposed in gimbaling socket structures 2105, 2110, and 2115 and the respective thermal array when engaged and operating. In this way, the DUTs can be cooled more effectively, and testing efficiency is improved. According to some embodiments, each socket structure is disposed on its own independent BIB baseplate. According to some embodiments, test system 2100 includes multiple rows of gimbaling socket structures that be used to test multiple DUTs in parallel.

Embodiments of the present invention are thus described. While the present invention has been described in particular embodiments, it should be appreciated that the present invention should not be construed as limited by such embodiments, but rather construed according to the following claims.

What is claimed is:

1. A test system for testing a device under test (DUT), the test system comprising:
   a socket structure coupled to a spring and operable to receive a DUT;
   the spring coupled to a baseplate, wherein the spring is under tension;
   the baseplate operable to support the socket structure in a rest position; and
   a thermal array comprising arms operable to lift the socket structure to bring the DUT into even and secure contact with the thermal array during operation to cool the DUT when the DUT is disposed in the socket structure.

2. The test system of claim 1, wherein the socket structure comprises:
   a socket that receives the DUT; and
   a socket interface board (SIB) coupled to the spring.

3. The test system of claim 1, wherein the baseplate comprises any number of support pillars operable to support the socket structure in the rest position.

4. The test system of claim 1, further comprising thermal interface material (TIM) disposed on the DUT and the thermal array, wherein the arms are operable to bring the TIM disposed on the DUT and the thermal array into secure and even contact.

5. The test system of claim 1, wherein the socket structure is a gimbaling socket structure operable to pivot in multiple directions when lifted by the arms to provide even and secure contact between the DUT and the thermal array.

6. The test system of claim 1, wherein the spring is operable to bring the socket structure back to the rest position when the socket structure is lowered by the arms under tension.

7. The test system of claim 1, wherein the spring applies tension substantially equivalent to 1 to 3 pounds.

8. The test system of claim 1, wherein the baseplate comprises a burn in board (BIB).

9. The test system of claim 1, further comprising a plurality of socket structures, each socket structure of the plurality of socket structures operable to receive a respective DUT of a plurality of DUTs, wherein the thermal array comprises arms corresponding to each of the plurality of socket structures to bring the plurality of DUTs into secure contact with the thermal array.

10. A test system for testing a device under test (DUT), the test system comprising:
    a plurality of socket structures, each socket structure coupled to a respective spring and operable to receive a respective DUT of a plurality of DUTs;
    the springs coupled to a baseplate, wherein the springs are under tension;
    the baseplate operable to support the socket structure in a rest position; and
    a plurality of thermal arrays, each thermal array corresponding to a respective socket structure, and wherein the thermal arrays comprise arms operable to lift the respective socket structure to bring the respective DUT into even and secure contact with a respective thermal array of the plurality of thermal arrays during operation to cool the respective DUT when the plurality of DUTs are disposed in the plurality of socket structures.

11. The test system of claim 10, wherein the plurality of socket structures each comprise:
    a socket that receives the respective DUT; and
    a socket interface board (SIB) coupled to the respective spring.

12. The test system of claim 10, wherein the baseplate comprises a plurality of support pillars operable to support the plurality of socket structures in the rest position.

13. The test system of claim 10, further comprising a plurality of baseplates, wherein each baseplate supports a respective socket structure of the plurality of socket structures.

14. The test system of claim 10, further comprising thermal interface material disposed on the respective DUT and on the respective thermal array, wherein the arms are operable to bring thermal interface materia (TIM) disposed on the respective DUT and the respective thermal array into secure and even contact.

15. The test system of claim 10, wherein the plurality of socket structures comprise gimbaling socket structures operable to pivot in multiple directions when lifted by the arms to provide even and secure contact between the plurality of DUTs and the plurality of thermal arrays.

16. The test system of claim 10, wherein the springs are operable to bring the plurality of socket structures back to the rest position when the plurality of socket structures is released by the arms.

17. The test system of claim 10, wherein the spring applies tension substantially equivalent to 1 to 3 lbf.

18. The test system of claim 10, wherein the baseplate comprises a burn in board (BIB).

19. The test system of claim 10, further comprising a plurality of baseplates that support the plurality of socket structures.

20. The test system of claim 10, wherein the plurality of thermal arrays comprise respective liquid cooled cold plates.

* * * * *